(12) United States Patent
Tada et al.

(10) Patent No.: US 7,484,513 B2
(45) Date of Patent: Feb. 3, 2009

(54) METHOD OF FORMING TITANIUM FILM BY CVD

(75) Inventors: Kunihiro Tada, Nirasaki (JP); Hayashi Otsuki, Naka-koma-gun (JP)

(73) Assignee: Tokyo Electron Limited, Tokyo (JP)

( * ) Notice: Subject to any disclaimer, the term of this patent is extended or adjusted under 35 U.S.C. 154(b) by 292 days.

(21) Appl. No.: 11/028,736

(22) Filed: Jan. 5, 2005

(65) Prior Publication Data

US 2005/0136660 A1 Jun. 23, 2005

Related U.S. Application Data

(60) Division of application No. 10/216,398, filed on Aug. 12, 2002, now Pat. No. 6,841,203, which is a continuation-in-part of application No. 09/713,008, filed on Nov. 16, 2000, now Pat. No. 6,451,388, which is a continuation-in-part of application No. 09/216,938, filed on Dec. 21, 1998, now Pat. No. 6,177,149.

(30) Foreign Application Priority Data

Dec. 24, 1997 (JP) .............................. 1997-366066

(51) Int. Cl.
  *H01L 21/44* (2006.01)
(52) U.S. Cl. ...................................... 134/1.1
(58) Field of Classification Search ............. None
  See application file for complete search history.

(56) References Cited

U.S. PATENT DOCUMENTS

| 5,665,640 | A | 9/1997 | Foster et al. |
| 5,721,021 | A | 2/1998 | Tobe et al. |
| 6,037,264 | A | * 3/2000 | Hwang ............... 438/714 |
| 6,051,286 | A | 4/2000 | Zhao et al. |
| 6,087,265 | A | * 7/2000 | Hwang ............... 438/706 |
| 6,143,362 | A | 11/2000 | Sandhu et al. |
| 6,177,149 | B1 | 1/2001 | Tada et al. |
| 6,197,674 | B1 | 3/2001 | Yoshikawa et al. |
| 6,265,318 | B1 | * 7/2001 | Hwang et al. ........ 438/720 |
| 6,277,762 | B1 | * 8/2001 | Hwang ............... 438/714 |
| 6,284,316 | B1 | 9/2001 | Sandhu et al. |
| 6,323,132 | B1 | * 11/2001 | Hwang et al. ........ 438/706 |
| 6,342,277 | B1 | 1/2002 | Sherman |
| 6,399,490 | B1 | 6/2002 | Jammy et al. |

(Continued)

Primary Examiner—Allan Olsen
(74) Attorney, Agent, or Firm—Smith, Gambrell & Russell, LLP

(57) ABSTRACT

A Ti film is formed by CVD in holes formed in an insulating film formed on a Si substrate or on a Si film formed on a Si substrate by a method according to the present invenitioin. The method includes the steps of loading a Si substrate into a film forming chamber; evacuating the chamber at a predetermined vacuum; supplying $TiCl_4$ gas, $H_2$ gas, Ar gas and $SiH_4$ gas into the film forming chamber; and producing a plasma in the film forming chamber to deposit a Ti film in the holes formed in the insulating film. The Si substrate is heated at 500° C. or below during the deposition of the Ti film. The flow rate of the $SiH_4$ gas is from 30 to 70% of the flow rate of the $TiCl_4$ gas. This method enables formation of a Ti film on a Si base at positions of holes in an insulating layer, with a good morphology of the interface between the Si base and the Ti film and with a good step coverage.

10 Claims, 12 Drawing Sheets

U.S. PATENT DOCUMENTS

| | | |
|---|---|---|
| 6,432,479 B2 | 8/2002 | Chang et al. |
| 6,432,493 B1 | 8/2002 | Taguwa |
| 6,451,388 B1 | 9/2002 | Tada et al. |
| 6,482,745 B1 * | 11/2002 | Hwang .................. 438/706 |
| 6,485,988 B2 * | 11/2002 | Ma et al. ................ 438/3 |
| 6,534,809 B2 * | 3/2003 | Moise et al. ............ 257/295 |
| 6,537,621 B1 | 3/2003 | Kobayashi et al. |
| 6,576,546 B2 * | 6/2003 | Gilbert et al. .......... 438/629 |
| 6,635,528 B2 * | 10/2003 | Gilbert et al. .......... 438/253 |
| 6,749,770 B2 * | 6/2004 | Hwang et al. .......... 252/79.1 |
| 6,777,342 B2 * | 8/2004 | Hwang .................. 438/706 |
| 6,806,038 B2 * | 10/2004 | Gu et al. ................ 430/318 |
| 2001/0044205 A1 * | 11/2001 | Gilbert et al. .......... 438/653 |
| 2002/0072016 A1 * | 6/2002 | Chen et al. ............. 430/323 |

* cited by examiner

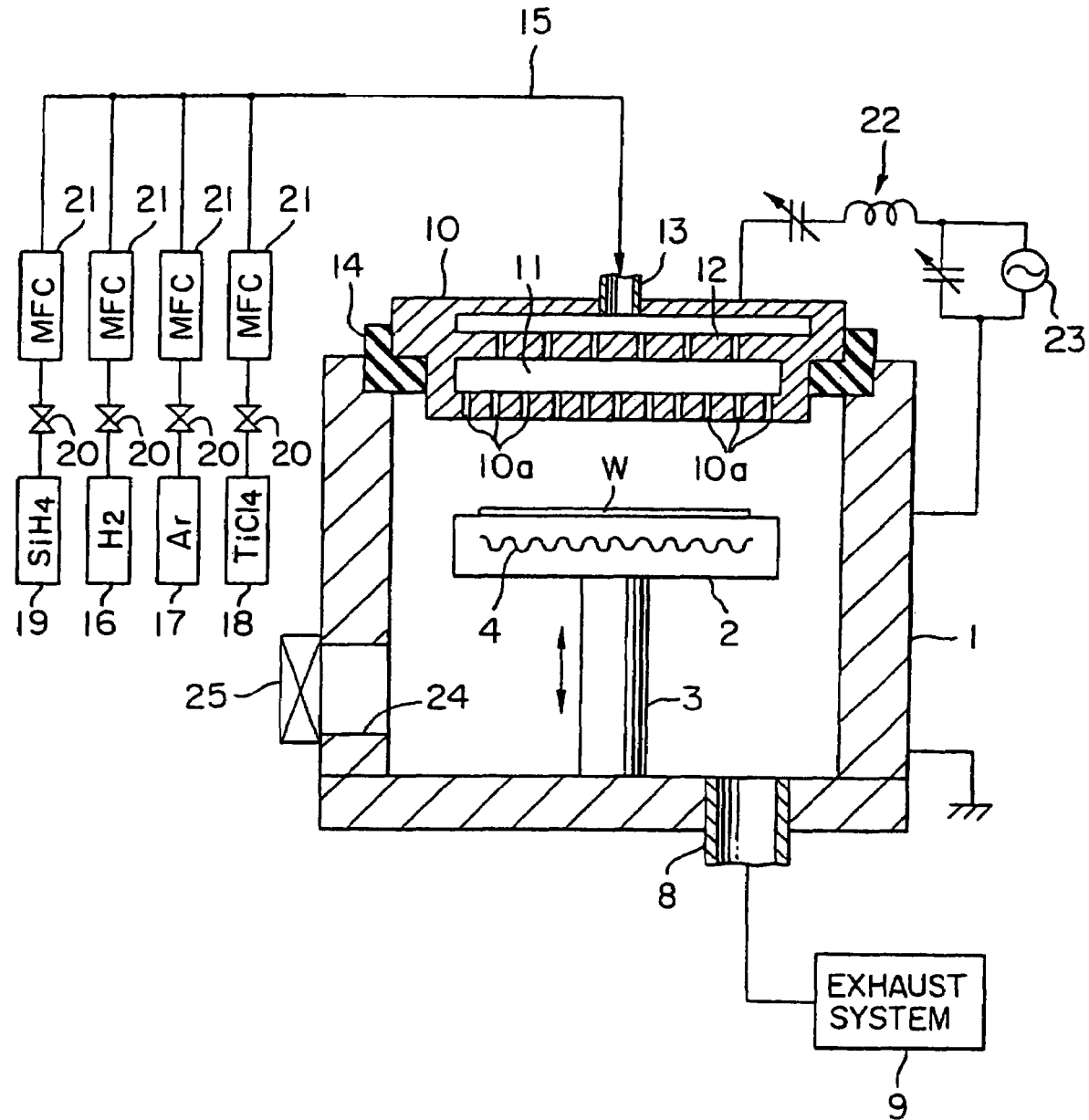
F I G. 1

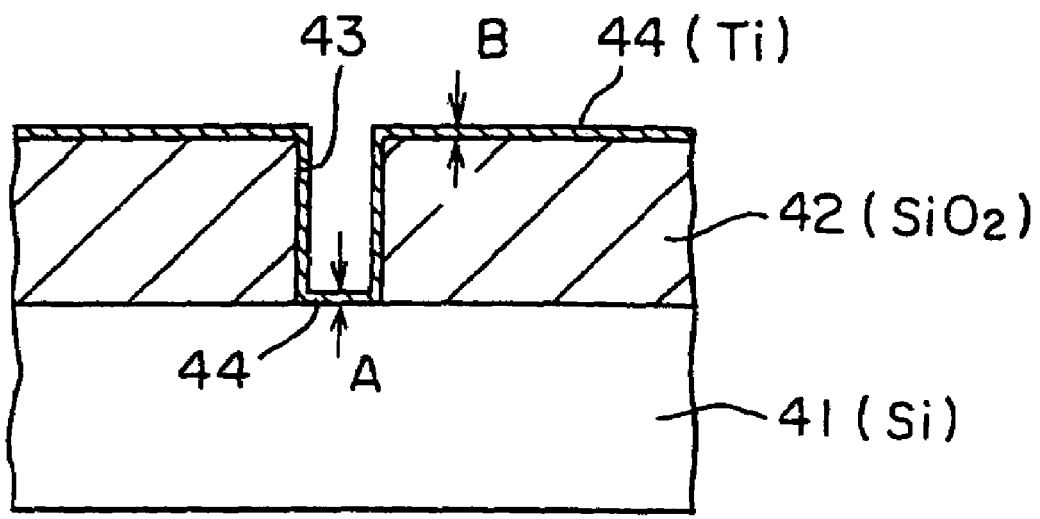
F I G. 2A
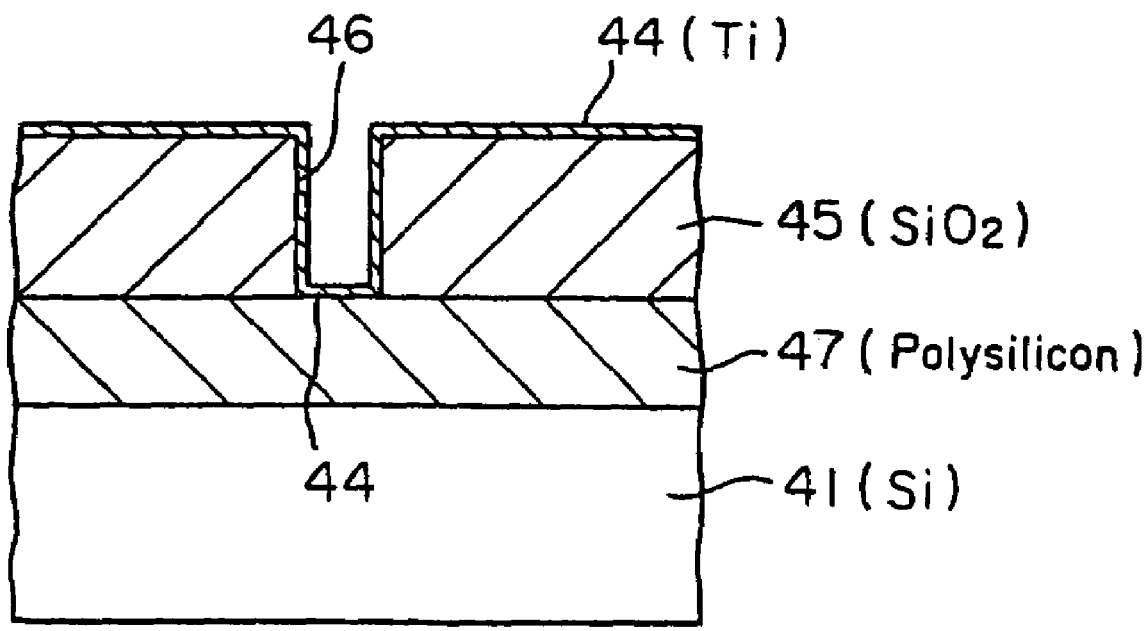
F I G. 2B

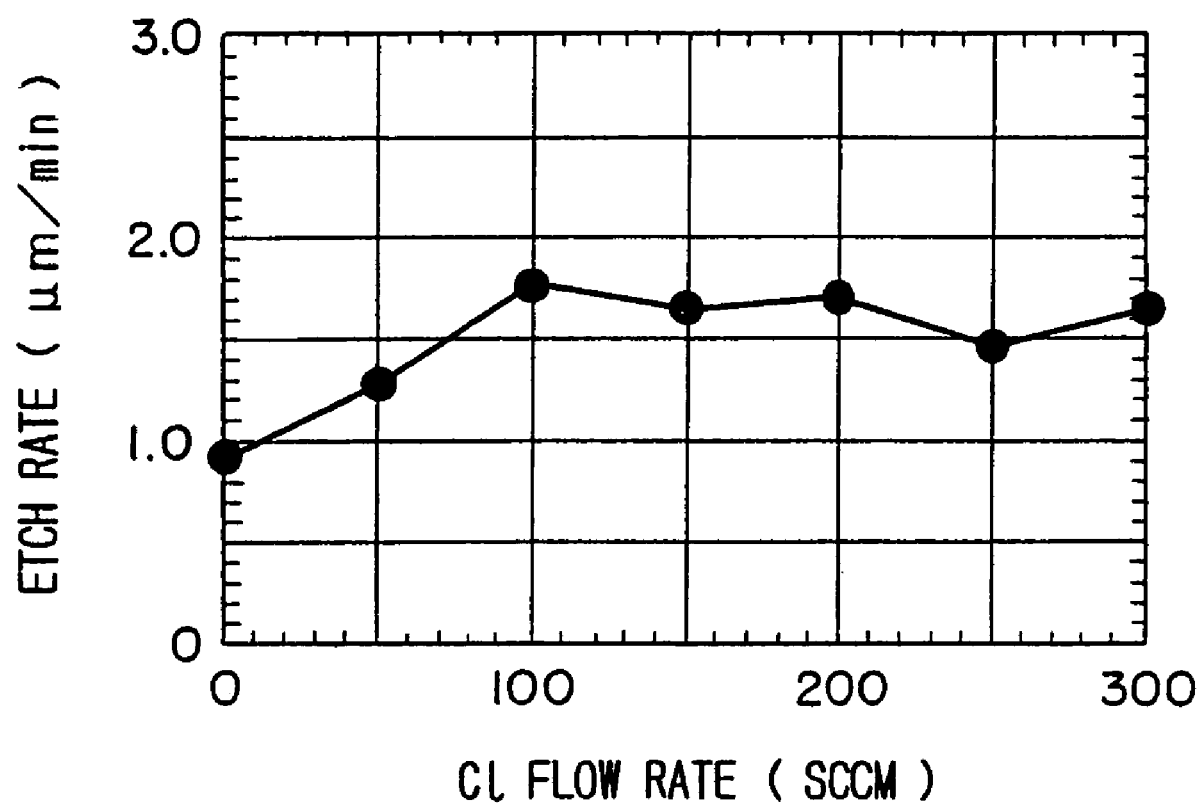
F I G. 14

METHOD OF FORMING TITANIUM FILM BY CVD

CROSS-REFERENCE TO RELATED APPLICATION

This is a divisional application of our application Ser. No. 10/216,398 filed Aug. 12, 2002, now U.S. Pat. No. 6,841,203 which is a continuation-in-part application of our application Ser. No. 09/713,008 filed Nov. 16, 2000, now U.S. Pat. No. 6,451,388, which is a continuation-in-part application of our application Ser. No. 09/216,938 filed Dec. 21, 1998, now U.S. Pat. No. 6,177,149, all of which are being incorporated in their entirety herein by reference.

BACKGROUND OF THE INVENTION

1. Field of the Invention

The present invention relates to a method of forming a titanium (Ti) film to be used as a contact metal film or an adhesion layer for a semiconductor device by a chemical vapor deposition (CVD) process.

2. Description of the Related Art

Recently, most semiconductor integrated circuits are fabricated in a circuit configuration of a multilevel structure to cope with market demand for high-density and large-scale integration. Accordingly, techniques for filling contact holes for the electrical connection of semiconductor devices formed in a lower layer to wiring lines formed in upper wiring layers, and via holes for the electrical connection of wiring lines in different wiring layers have become important.

Generally, aluminum (Al), tungsten (W), aluminum-base alloys and tungsten-base alloys are used for filling contact holes and via holes. If a contact hole (or a vie hole) is filled with such a metal or an alloy, which is in direct contact with an Al wiring line or a silicon (Si) substrate in a lower layer, it is possible that an alloy of silicon and aluminum is produced in the boundary owing to the diffusion of Al and Si. Such an alloy has a high resistivity and is undesirable in view of need to reduce the power consumption and to increase the operating speed of integrated circuits. If W or a W-base alloy is used for filling a contact hole, $WF_6$ gas as a source gas for depositing W or the W-base alloy tends to deteriorate the electrical properties of the Si substrate.

To avoid such problems, a barrier layer is formed on surfaces defining contact holes or via holes before filling the contact holes and the via holes with the filling metal. Generally, a two-layer barrier layer consisting of a Ti film and a TiN (titanium nitride) film is used as the barrier layer. It has been the usual way to form such a barrier layer by a physical vapor deposition (PVD) process. However, a PVD film has a poor coverage and is incapable of meeting the requirements of tight design rule, the reduction of the width of lines and diameter of openings and the increase of aspect ratio to meet the recent demand for the enhancement of the level of integration and the miniaturization of IC chips.

Recently, Ti films and TiN films have been formed by a CVD process capable of forming such films in a better film quality than the PVD process. The Ti film serving as a contact metal film is formed by a plasma CVD process. Usually, the plasma CVD process for forming a Ti film uses $TiCl_4$ gas as a source gas, $H_2$ gas and Ar gas. During the plasma CVD process, Si forming the substrate and Ti contained in the source gas interact and Si diffuses in the Ti layer, deteriorating the morphology of a $TiSi_x$ (typically; $TiSi_2$) interfacial layer formed between the Si substrate and the Ti layer. The diffusion of Si into the Ti layer is liable to cause junction leakage when the Ti layer is used for filling a contact hole and affects adversely to electrical connection when the same is used for filling a via hole.

The aspect ratio of contact holes and via holes formed in $SiO_2$ insulating films has increased with the progressive miniaturization of IC chips. Therefore, the Ti film is required to be formed in a satisfactory step coverage.

Meanwhile, when forming the Ti film on the semiconductor wafer, Ti films are also formed on the vessel wall. For the purpose of removing such undesirable Ti films, in-situ cleaning is executed regularly. However, the conventional plasma cleaning methods can not remove the Ti films at a satisfactory etch rate.

The present invention has been made in view of the above and it is therefore an object of the present invention to provide a method of forming a Ti film by CVD, capable of forming a Ti film in minute holes formed in an insulating film in a satisfactory step coverage without deteriorating the morphology of a $TiSi_x$ interfacial layer formed between the Ti film and a Si base.

The second object of the present invention is to provide a method of removing films formed on a vessel wall or the like at a satisfactory etch rate.

SUMMARY OF THE INVENTION

According to the present invention, there is provided a method of forming a titanium film by chemical vapor deposition in holes formed in an insulating film provided on a silicon base, the method comprising the steps of: loading a silicon base having thereon an insulating film formed with the holes into a film forming chamber; evacuating the chamber at a predetermined vacuum; supplying processing gases including $TiCl_4$ gas, a reduction gas, Ar gas and $SiH_4$ gas into the film forming chamber; and producing a plasma in the film forming chamber to deposit a titanium film in the holes formed in the insulating film, while said silicon base is heated at a temperature of from 550 to 700° C., and while said $TiCl_4$ gas and said $SiH_4$ gas are supplied with a flow rate of the $SiH_4$ gas being from 1 to 50% of a flow rate of the $TiCl_4$ gas, to thereby obtain a silicon-to-insulating film selectivity of not less than one.

The flow rates of the processing gases may be selected so that the silicon-to-insulating film selectivity is three or more. $SiH_4$ may have a flow rate which is from about 0.005 to about 0.25% of the flow rate of all of the processing gases. The temperature of the silicon base during the film formation is preferably from 580 to 700° C. $H_2$ gas is used most advantageously as the reduction gas.

The inventors of the present invention made studies to form a Ti film by CVD in a satisfactory step coverage without deteriorating the morphology of the $TiSi_x$ layer and found that such a Ti film can be formed when the temperature of the substrate is 550° C. or above, SiH4 gas is used in addition to $TiCl_4$ gas, $H_2$ gas and Ar gas, and the respective flow rates of those processing gases are adjusted properly.

The deterioration of the morphology of the $TiSi_x$ interfacial layer formed between the Ti film and the Si base is caused by the interaction of Si and Ti, and the irregular diffusion of Si into the Ti film during the formation of the Ti film. $SiH_4$ gas suppresses the irregular diffusion of Si into the Ti film to prevent the deterioration of the morphology of the $TiSi_x$ layer. However, since $SiH_4$ gas is a reducing gas, $TiSi_x$ is produced by the interaction of $SiH_4$ gas and $TiCl_4$ gas and such a reaction deteriorates the step coverage.

To utilize the function of $SiH_4$ to avoid deteriorating the morphology of the $TiSi_x$ layer without deteriorating the step coverage of the CVD-Ti film, it is effective to increase the silicon-to-insulating film selectivity by heating the substrate at 550° C. or above during the film forming process, and to adjust the flow rates of the processing gases, particularly the flow rate of $SiH_4$ gas, so that the silicon-to-insulating film selectivity is not less than one. The present invention has been made on the basis of such knowledge.

The inventors also found that, even if the substrate temperature is 500° C. or below, a satisfactory step coverage without deteriorating the morphology of the $TiSi_x$ layer can be achieved under the specific process conditions.

According to the second aspect of the present invention, there is provided a method of forming a titanium film by CVD in holes formed in an insulating film formed on a silicon base. The method including the steps of: loading a silicon base formed with holes into a film forming chamber; evacuating the chamber at a predetermined vacuum; supplying processing gases including $TiCl_4$ gas, a reduction gas, Ar gas and $SiH_4$ gas into the film forming chamber; and producing a plasma in the film forming chamber to deposit a titanium film in the holes formed in the insulating film; wherein the silicon base is heated at 300 to 500° C. during deposition of the titanium film, and a flow rate of the $SiH_4$ gas is from 30 to 70% of a flow rate of the $TiCl_4$ gas.

The present invention also provides a cleaning method of removing Ti films or the like formed on, for example vessel wall. The cleaning method including the steps of: evacuating a plasma generating chamber, which is remote from the film forming chamber, at a predetermined vacuum; supplying gases including an inert gas, a fluorine-containing gas, and a chlorine-containing gas into the plasma generating chamber; producing a plasma in the plasma generating chamber; heating the surfaces at a predetermined temperature; and feeding the plasma from the plasma generating chamber into the film forming chamber so that the plasma reacts with the films to decompose the films.

The present invention provides another cleaning method, which includes the steps of: evacuating the film forming chamber at a predetermined vacuum; heating the surfaces at a predetermined temperature; supplying gases including an inert gas, HF gas, and HCl gas into the film forming chamber so that the gases react with the films to decompose the films.

The above and other objects, features and advantages of the present invention will become more apparent from the following description taken in connection with the accompanying drawings.

BRIEF DESCRIPTION OF THE DRAWINGS

FIG. 1 is a sectional view of a film forming system for carrying out a method of forming a Ti film by CVD in a preferred embodiment of the present invention;

FIGS. 2A and 2B are is a fragmentary sectional views of Si substrates to which the present invention is applied;

FIG. 14 is a graph showing the dependence of the etch rate of $SiO_2$ film on the flow rate of $Cl_2$ gas.

DESCRIPTION OF THE PREFERRED EMBODIMENTS

Figure 3A:
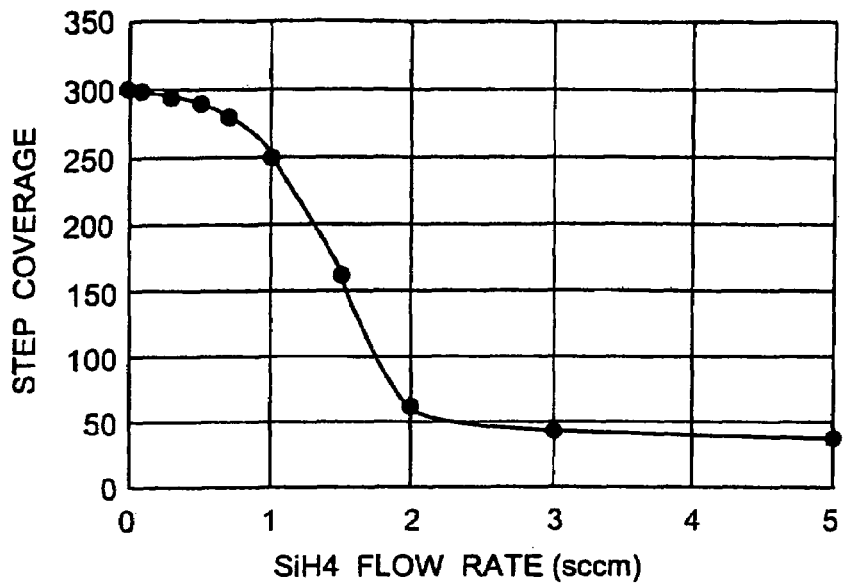
FIG. 3A is a graph showing the dependence of step coverage on the flow rate of $SiH_4$ gas.

Referring to FIG. 1, a film forming system for carrying out a method of forming a titanium (Ti) film by CVD in a preferred embodiment of the present invention has a substantially cylindrical vessel 1 defining an airtight film forming chamber, a susceptor 2 for supporting a silicon (Si) wafer or substrate W, i.e., an objected to be processed, in a horizontal attitude thereon, and a cylindrical support member 3 supporting the susceptor 2 for vertical movement. A heating element 4 is embedded in the susceptor 2. Power is supplied by a power source, not shown, to the heating element 4 to heat a silicon (Si) wafer W supported on the susceptor 2 at a predetermined temperature.

A shower head 10 is disposed on the upper wall of the vessel 1 so as to face a Si wafer W supported on the susceptor 2. The shower head 10 has a lower wall provided with a plurality of gas discharge holes 10a and facing a Si wafer W supported on the susceptor 2, a space 11, a perforated diffusing wall 12 formed in the space 11, and an upper wall provided with a gas supply port 13. A gas supply pipe 15 is connected to the gas supply port 13.

The gas supply pipe 15 is connected to hydrogen (H) gas source 16, an argon (Ar) gas source 17, a titanium tetrachloride ($TiCl_4$) gas source 18 and a silane ($SiH_4$) gas source 19 through mass flow controllers 21 and valves 20. The processing gases are supplied from the gas sources 16, 17; 18 and 19 through the gas supply pipe 15 and the shower head 10 into the film forming chamber defined by the vessel 1, whereby a titanium (Ti) film is formed on the silicon wafer.

A radio frequency power source 23 is connected through a matching circuit 22 to the shower head 10 to apply a radio frequency voltage to the shower head 10. The processing gases are ionized in the vessel 1 by radio frequency power supplied to the shower head 10 to produce a plasma of the source gas in the vessel 1. The shower head 10 is electrically isolated from the vessel 1 by an insulating member 14, and the vessel 1 is grounded.

The bottom wall of the vessel 1 is provided with an exhaust port 8. An exhaust system 9 for evacuating the vessel 1 is connected to the exhaust port 8. The vessel 1 has a side wall provided in its lower part with an opening 24. A gate valve 25 is disposed in the opening 24 to open and close the opening 24. The gate valve 25 is opened and the susceptor 2 is lowered to its lower position when carrying a wafer W into and carrying the same out of the vessel 1 through the opening 24.

When forming a Ti film by the film forming system, the gate valve 25 is opened, a Si wafer W is loaded into the vessel 1 and is mounted on the susceptor 2, the Si wafer W is heated by the heating element 4, the vessel is evacuated to a high vacuum by a vacuum pump included in the exhaust system 9, $TiCl_4$ gas, $H_2$ gas, Ar gas and $SiH_4$ gas are supplied into the vessel 1, and a radio frequency voltage is applied to the shower head 10 by the radio frequency power source 23 to produce a plasma in the shower head 10.

As shown in FIG. 2A, the Si wafer W on which a Ti film is to be formed is, for example, a Si substrate 41 provided with an insulating film 42 of $SiO_2$ and contact holes 43 (only one of them is shown) formed in the insulating film 42 or, as shown in FIG. 2B, a Si substrate 41 provided with a polysilicon film 47 formed on the Si substrate 41, an insulating film 45 of $SiO_2$ formed on the polysilicon film 47, and via holes 46 (only one of them is shown) as shown in FIG. 2B. An insulating layer may be formed between the Si substrate 41 and the polysilicon film 47. The Si substrate 41 and the polysilicon film 47 will generally be referred to as "silicon base 2."

In this embodiment, $SiH_4$ gas is used and process conditions are determined so that Si-to-$SiO_2$ selectivity is not less than one to deposit a Ti film 44 on the bottoms of the contact holes 43 or the bottoms of the via holes 46 in a high step coverage, maintaining an interfacial layer formed between the Si base 41 and the Ti film 44 in a satisfactory morphology (conditions of the surface and section of the interfacial layer). That is, process conditions are determined so that Ti is deposited on portions of the surface of the Si wafer 41 forming the bottom surfaces of the contact holes 43 or on portions of the polysilicon film 44 forming the bottom surfaces of the via holes 46, at a deposition rate higher than that at which Ti is deposited on the surface of the insulating film 42 of $SiO_2$ or the insulating film 45 of $SiO_2$. More concretely, the Si substrate 41 (or Si substrate 41 including the polysilicon film 47) is heated at a temperature of from 550 to 700° C. to increase the Ti deposition rate on the Si substrate 41, and the flow rates of the processing gases, particularly, the flow rate of $SiH_4$ gas is controlled as described later so that Si-to-$SiO_2$ selectivity is one or above. Thus, the Ti film can be formed in high step coverage in the contact hole 43 or the via hole 46; that is, the thickness of the Ti film at the top of the contact hole 43 or the via hole 46 is not great. When Si-to-$SiO_2$ selectivity is three or above, the Ti film can be formed in a more satisfactory step coverage. The step coverage is expressed as A/B where A is the thickness of a Ti film formed on the Si substrate 41 in FIGS. 2A and B is the thickness of a Ti film formed on the $SiO_2$ layer 42.

To form an interfacial layer of a satisfactory morphology and securing a high Si-to-$SiO_2$ selectivity, a preferable $SiH_4$ flow rate is in the range of 0.1 to 5 sccm. If $SiH_4$ flow rate is less than 0.1 sccm, the effect of $SiH_4$ on the improvement of the morphology of the interfacial layer is insignificant. If $SiH_4$ flow rate is greater than 5 sccm, it is difficult to adjust the Si-to-$SiO_2$ selectivity to a desired value.

Preferable flow rates of $TiCl_4$ gas, $H_2$ gas and Ar gas are in the range of 1 to 30 sccm, more preferably 3 to 10 sccm, in the range of 0.1 to 5 slm, more preferably 0.5 to 2 slm, and in the range of 0.1 to 3 slm, more preferably 0.3 to 2 slm, respectively. It is preferable that the output capacity of the radio frequency power source is in the range of 100 to 800 W, more preferably 100 to 500 W, and the pressure in the vessel 1 is in the range of 0.5 to 5 torr, more preferably 1 to 3 torr.

Experiments were conducted to verify the effects of the present invention, in which Ti films were formed on a $SiO_2$ film provided with contact holes. In the experiments, the vessel 1 was evacuated to 1.0 torr, the output power of the radio frequency power source 23 (13.56 MHz) was 200 W, $H_2$ gas flow rate was 1 slm, Ar gas flow rate was 1 slm, $TiCl_4$ gas flow rate was 10 sccm, and $SiH_4$ gas flow rate was varied in the range of 0 to 5 sccm.

FIG. 3A is a graph showing the relationship of the step coverage with the flow rate of $SiH_4$ gas when the Si wafer was heated at 620° C. The flow rates of $TiCl_4$, Ar and $H_2$ were 10 sccm, 1 slm and 1 slm, respectively. The diameter of the holes was about 0.6 micrometer, and the aspect ratio was about 4. As is obvious from FIG. 3A, the step coverage decreases with the increase of the $SiH_4$ flow rate.

Figure 3B:
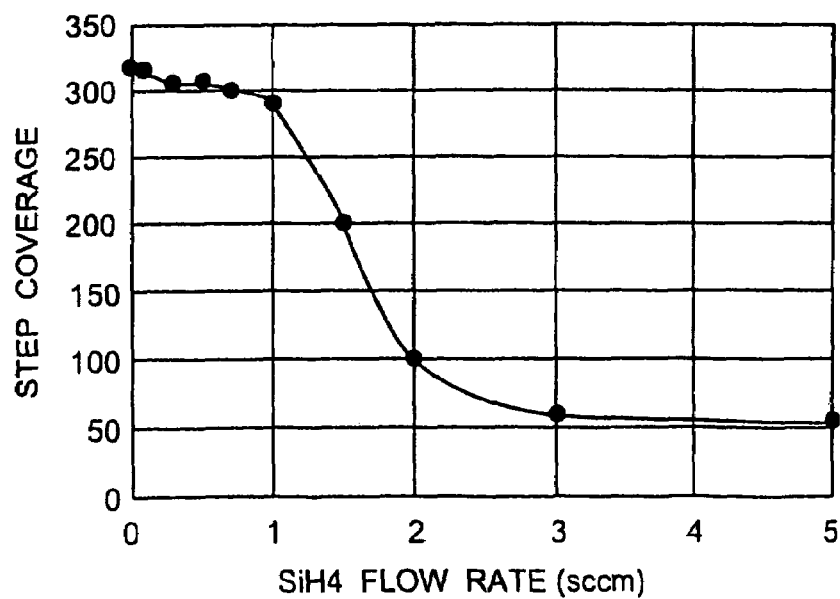
FIG. 3B is another graph showing the dependence of step coverage on the flow rate of $SiH_4$ gas.

FIG. 3B is another graph showing the relationship of the step coverage with the flow rate of $SiH_4$ gas when the Si wafer was heated at 650° C. The flow rates of $TiCl_4$, Ar and $H_2$ were 10 sccm, 1 slm and 1 slm, respectively. The diameter of the holes was about 0.6 micrometer, and the aspect ratio was about 4. As is obvious from FIG. 3B, the step coverage also decreases with the increase of the $SiH_4$ flow rate.

Figure 4:
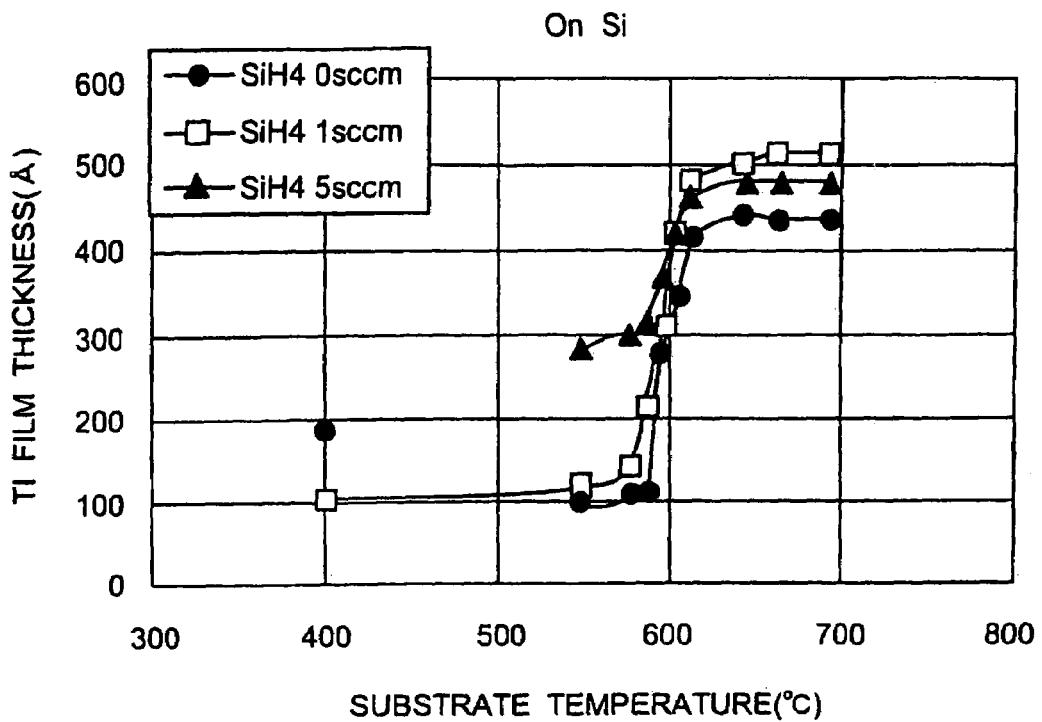
FIG. 4 is a graph showing the dependence of the thickness of a Ti film formed on Si on the temperature of the Si substrate for $SiH_4$ flow rates of 0 sccm, 1 sccm and 5 sccm.
Figure 5:
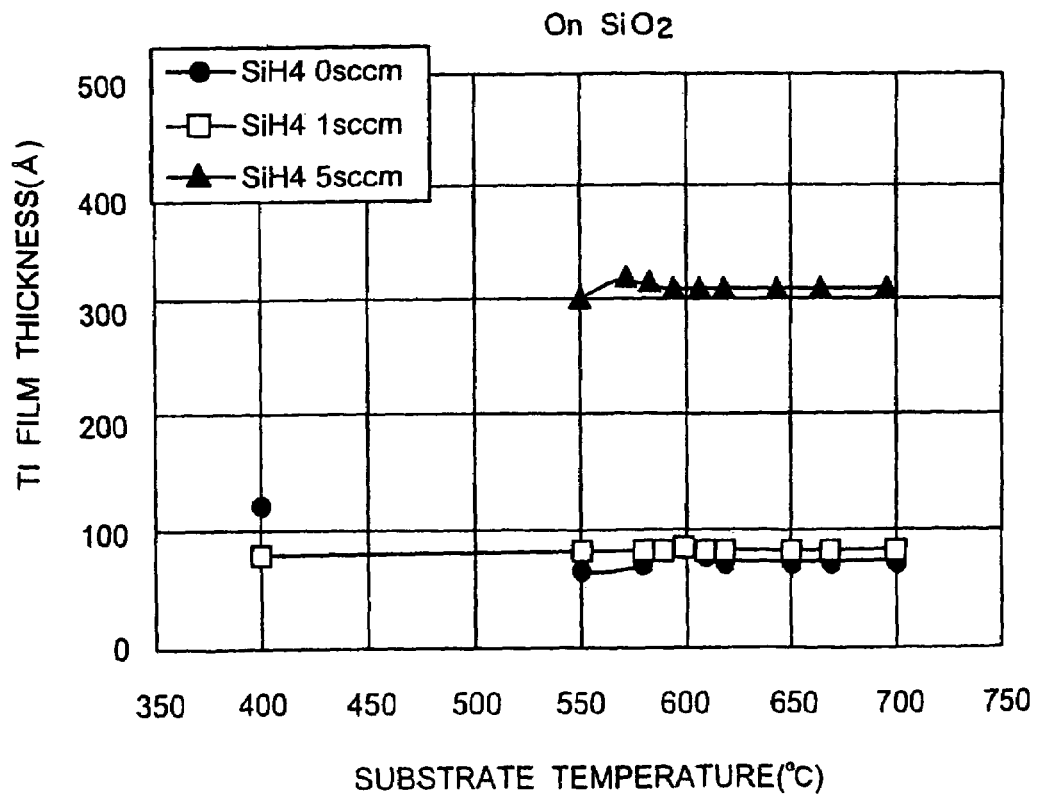
FIG. 5 is a graph showing the dependence of the thickness of a Ti film formed on $SiO_2$ on the temperature of the Si substrate for $SiH_4$ flow rates of 0 sccm, 1 sccm and 5 sccm.

FIG. 4 is a graph showing the relationship of the thickness of a Ti film formed on a Si substrate with the temperature of the Si substrate, for $SiH_4$ flow rates of 0 sccm, 1 sccm and 5 sccm determined on the basis of experiments, in which the temperature of the Si substrate was varied up to 700° C. It will be noted that the Ti film thickness begins to increase when the temperature exceeds 550° C. Particularly when the temperature exceeds 580° C., the film thickness increases sharply. FIG. 5 is a graph showing the relationship of the thickness of a Ti film formed on $SiO_2$ with the temperature of the Si substrate, for $SiH_4$ flow rates of 0 sccm, 1 sccm and 5 sccm determined on the basis of experiments, in which the temperature of the Si substrate was varied up to 700° C. It is observed that the Ti film thickness does not change substantially with the temperature change. As is obvious from FIGS. 4 and 5, the Si-to-$SiO_2$ selectivity increases with the increase of the temperature of the Si substrate beyond 550° C. and is very high when the temperature of the Si substrate is 580° C. or above (practically up to 700° C.). The Si-to-$SiO_2$ selectivity is greater than one even if $SiH_4$ flow rate is as much as 5 sccm when the temperature of the Si substrate is 700° C. It is known from FIGS. 4 and 5 that the Si-to-$SiO_2$ selectivity is equal to or greater than one at $SiH_4$ flow rate in the range of 0 to 5 sccm if the temperature of the Si substrate is from 550 to 700° C. However, a flow rate of less than 0.1 of the $SiH_4$ gas has almost no effect on the improvement of the morphology of the interfacial layer, so that the lower limit of the $SiH_4$ flow rate is determined as 0.1 sccm.

This range of the flow rate (0.1 to 5 sccm) of $SiH_4$ corresponds to about 0.005 to about 0.25% of the flow rate of all the processing gases and about 1 to about 50% of the flow rate of the $TiCl_4$ gas. The step coverage improves if the Si-to-$SiO_2$ selectivity increases, and an allowable step coverage can be achieved when the Si-To-$SiO_2$ selectivity is one or above.

Figure 6:
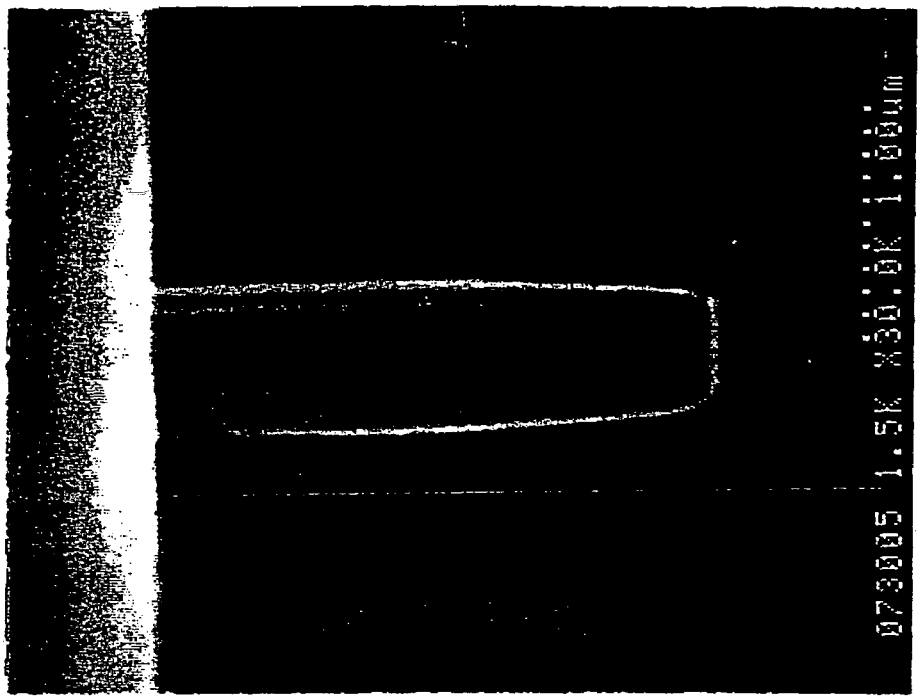
FIG. 6 is an electron micrograph of a Ti film formed in a contact hole with the substrate heated at 620° C. and $SiH_4$ supplied at 1 sccm.
Figure 7:
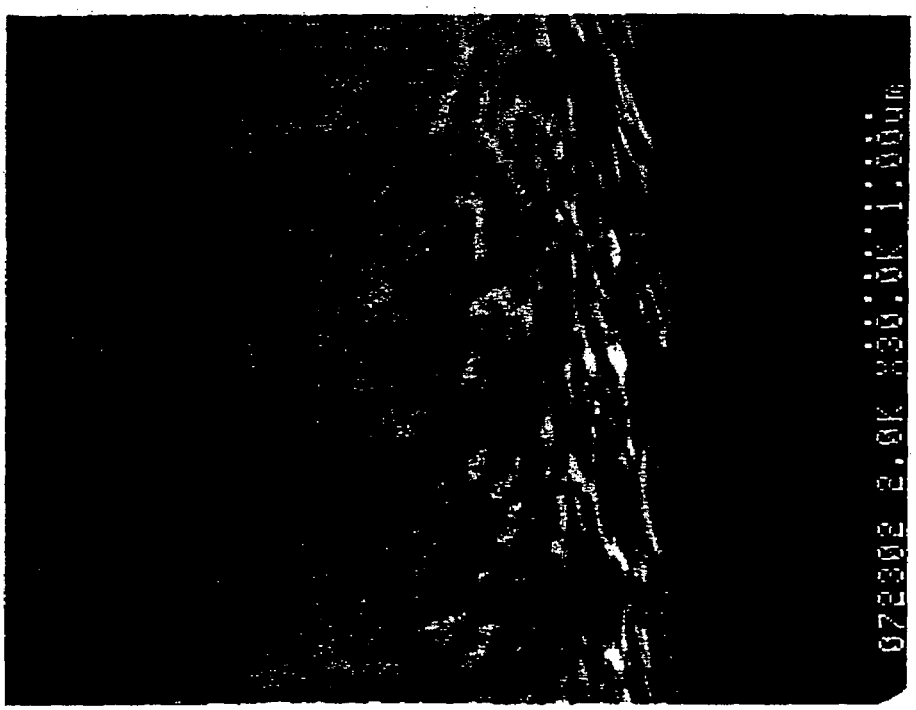
FIG. 7 is an electron micrograph of a $TiSi_x$ interfacial layer formed between a Si base and a Ti film formed on the Si base.

FIG. 6 is an electron micrograph of a Ti film formed in a contact hole with the substrate heated at 620° C. and $SiH_4$ supplied at 1 sccm. The Ti film is formed in the contact hole in a high step coverage. FIG. 7 is an electron micrograph of a $TiSi_x$ interfacial layer formed between a Si base and a Ti film formed on the Si base by the diffusion of Si into the Ti film. The electron microphotograph as taken after removing the $TiSi_x$ film with dilute hydrofluoric acid. FIG. 7 proves that $SiH_4$ is effective in improving the morphology of the interfacial layer.

The experiments proved that both the morphology of the interfacial layer between the Si base and the Ti film and step coverage are satisfactory when $SiH_4$ gas is used in addition to $TiCl_4$ gas, $H_2$ gas and Ar gas, the Si substrate is heated at a temperature of from 550 to 700° C., and the flow rates of the processing gases, particularly, the f low rate of $SiH_4$ gas is controlled properly.

As described above, a process gas with a higher $SiH_4$ concentration provides $TiSi_x$ interfacial layer with a better morphology, whereas a process gas with a lower $SiH_4$ concentration provides a better step coverage. Therefore, in an early stage of a Ti deposition, the $SiH_4$ concentration may be from 20% to 50% of the $TiCl_4$ gas, or from 0.1% to 0.25% of the total gas. Following that stage, the $SiH_4$ concentration may be changed to less than 0.1% of the total gas, or less than 20% of the $TiCl_4$ gas. This process can provide the interfacial layer with a better morphology and a titanium film with a better step coverage.

Figure 8:
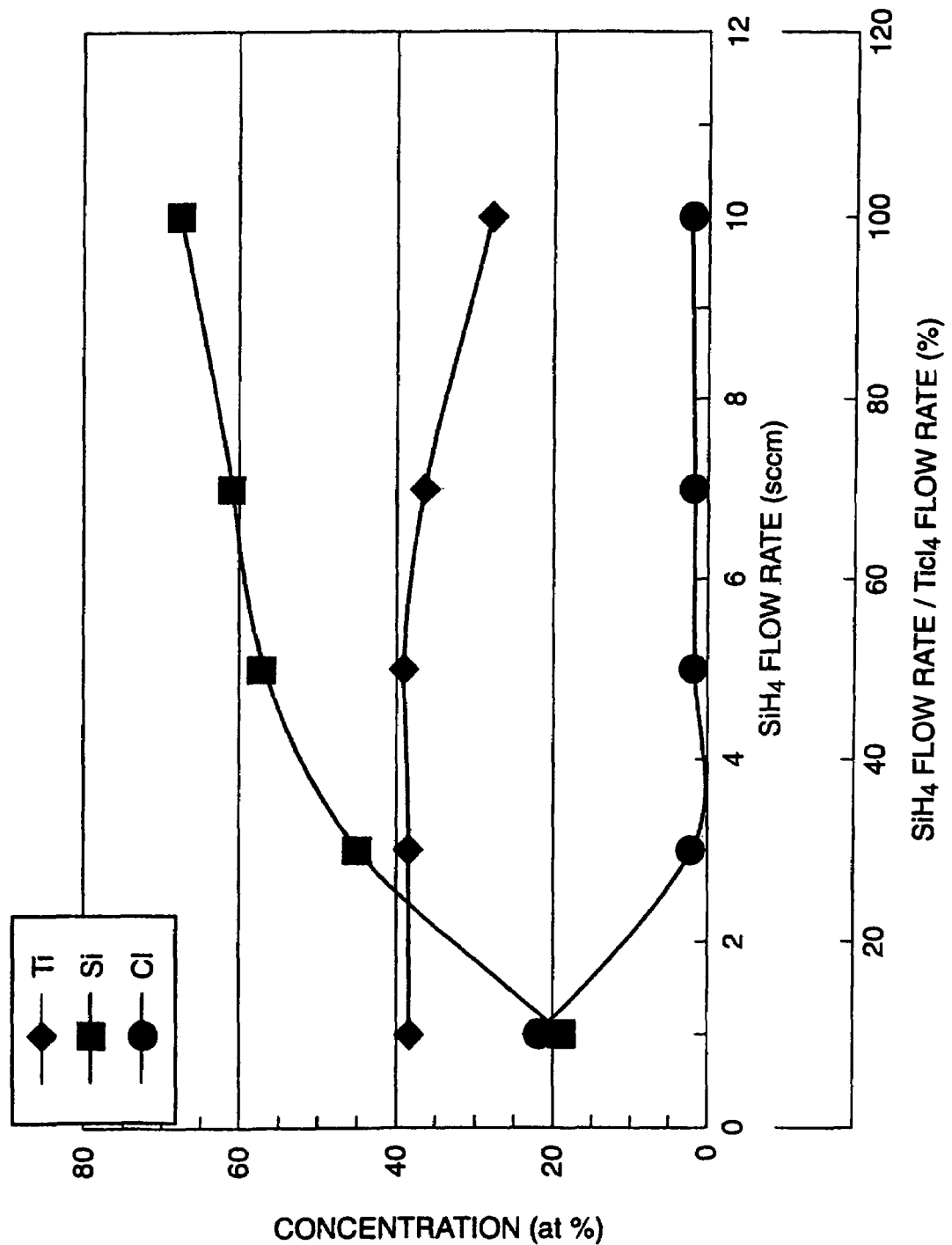
FIG. 8 is a graph showing the dependence of Cl concentration on the flow rate of $SiH_4$ gas relative to the $TiCl_4$ gas.

The Si substrate provided with the Ti film 44 thus formed may be further formed thereon with an additional titanium nitride (TiN) barrier film 50, as shown in FIG. 8. In order to form the TiN barrier film 50, the Ti film 44 on the Si substrate is preliminarily subjected to a nitriding treatment so that the surface portion of the Ti film 44 is caused to have a nitrides surfaces layer. Thereafter, a process is carried out to form a TiN barrier film 50 on the nitrided surface layer. The Ti film forming step, the nitriding treatment step and the TiN barrier film forming step can be carried out in the same processing chamber such as that shown in FIG. 1. Alternatively, the Ti film forming step and the nitriding treatment step can be carried out in the same processing chamber, and the TiN barrier film forming step may be carried out in a separate processing chamber.

The nitriding treatment is carried out preferably at a pressure of from 0.5 to 10 torr, more preferably from 1 to 5 torr, and at a temperature of from 300 to 700° C., more preferably from 500 to 700° C. In the nitriding treatment, $NH_3$ and $N_2$ gases are supplied into the chamber. The flow rate of the $NH_3$ gas is from 50 to 2000 sccm, preferably from 500 to 10001 sccm. The flow rate of the $N_2$ gas is from 50 to 1000 sccm, preferably from 100 to 500 sccm. The $N_2$ gas may not be used. Plasma could be generated during the nitriding treatment. In this case, the operating conditions are as follows:

The pressure is from 0.5 to 10 torr, more preferably from 1 to 3 torr, and the temperature is from 300 to 700° C. More preferably from 500 to 700° C. The ratio frequency power applied is from 100 to 800 W, preferably 200 to 500 W. Usable radio frequency is from 450 kHz to 60 MHz, and preferably from 450 kHz to 13.56 MHz. The flow rate of the $N_2$ gas is from 50 to 1000 sccm, preferably from 100 to 1000 sccm. Instead of using only the $N_2$ gas, $NH_3$ gas or ($NH_3$ and N) could be used.

The TiN barrier film forming step is carried out preferably at a pressure of from 0.5 to 10 torr, more preferably from 0.3 to 5 torr, and at a temperature of from 300 to 800° C. In the TiN barrier film forming step, $TiCl_4$ gas, $NH_3$ gas and $N_2$ gas are supplied into the processing chamber. The flow rate of the $TiCl_4$ gas is from 1 to 50 sccm, preferably from 1 to 20 sccm. The flow rate of the $NH_3$ gas is from 50 to 2000 sccm, preferably from 200 to 1000 sccm, and the flow rate of the $N_2$ gas is from 50 to 2000 sccm, preferably from 100 to 1000 sccm.

After the TiN barrier film is thus formed as a thin film on the Ti film, a metal 51 having a high melting point may be applied to the surface of the TiN barrier film 44 to fill the holes 43. Such high melting point metal is, for example, Al, W, AlSiCu, Cu, etc.

The present invention is not limited in its practical application to the embodiments specifically described herein. For example, other gasses may be used in addition to $TiCl_4$ gas, $H_2$ gas and Ar gas and $SiH_4$ gas, and process conditions are not limited to those described above.

Figure 9:
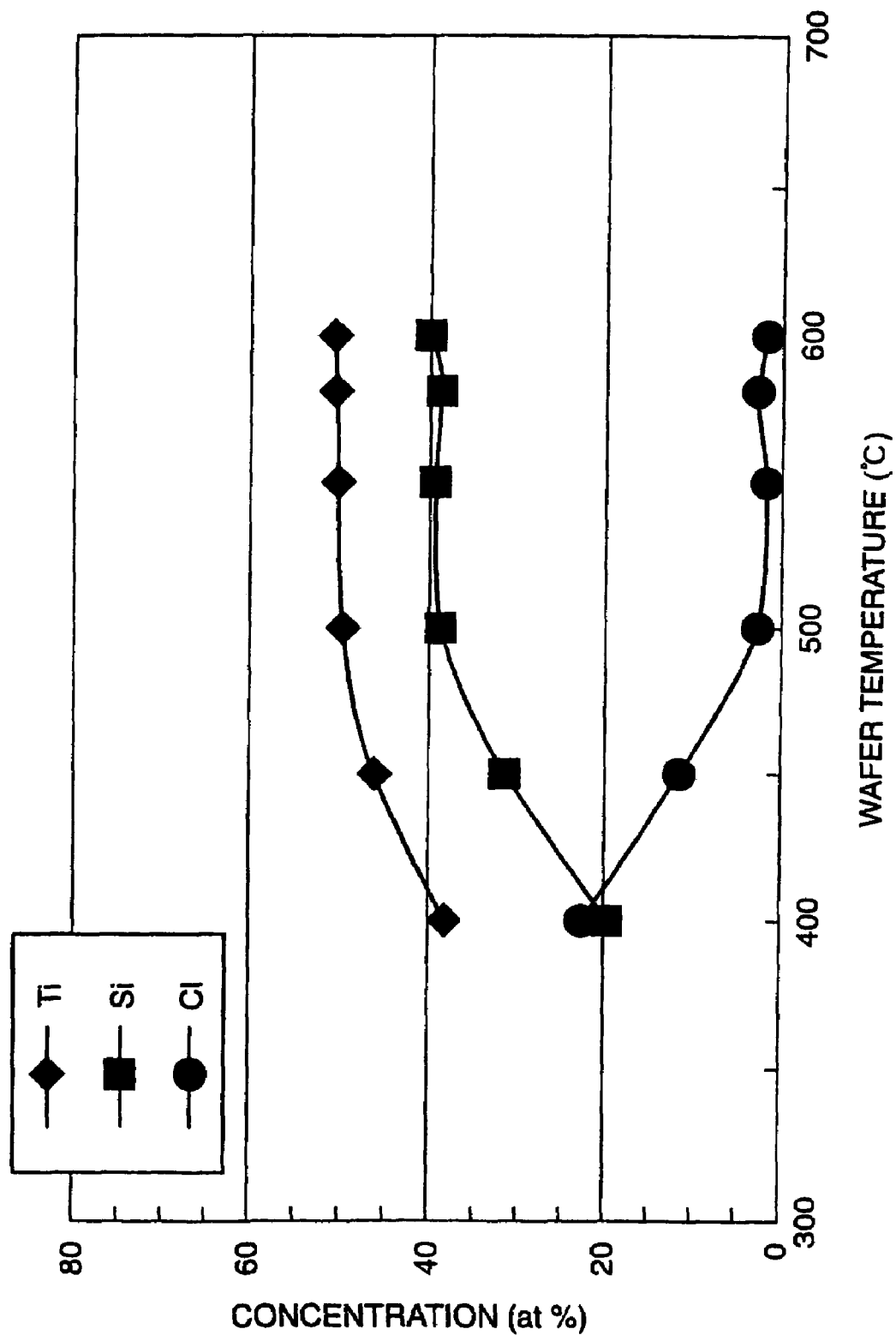
FIG. 9 is a graph showing the dependence of Cl concentration on the temperature, when $SiH_4$ gas is not used.

Another embodiment of the present invention will be described with reference to FIGS. 1, 8 and 9. In the aforementioned embodiment, the Ti film formation is carried out at high temperatures, such as 550° C. or above. The aforementioned process provides the interfacial layer with a good morphology and a titanium film with a high step coverage.

However, higher-density and larger-scale integration of the semiconductor integrated circuit results in reduction of the diffusion-area thickness of the shallow junction. Accordingly, if high thermal stress is subjected to the diffusion area, it is possible that some problems might arise. If a Ti film is formed on the bottom of the contact hole at high temperature, silicon included in the diffusion area diffuses into the Ti film, and the thickness of the diffusion area is reduced, resulting in leakage current in practical use.

With respect to the above, the Ti film is preferably formed at low temperatures. However, if the Ti film is formed by using $TiCl_4$ gas, $H_2$ gas and Ar gas and without using $SiH_4$ gas at low temperatures, the resulting Ti film has high Cl concentration and thus is not useful.

With respect to the above, in this embodiment, a Ti film with low Cl concentration is formed at low temperatures by using $SiH_4$ gas under specific process conditions. The CVD system shown in FIG. 1 may be used. The object, on which the Ti film is to be formed, may be the same as that shown in FIGS. 2A and 2B.

The process steps for the Ti film formation at low temperatures is the same as those of the Ti-film formation at high temperatures, except for the process conditions. When forming a Ti film by the CVD system, the gate valve 25 is opened. A Si wafer W is loaded into the vessel 1 to be placed on the susceptor 2. The Si wafer W is heated by the heating element 4, and the vessel 1 is evacuated to a high vacuum by a vacuum pump included in the exhaust system 9. $TiCl_4$ gas, H gas, Ar gas and $SiH_4$ gas are supplied into the vessel 1. A radio frequency voltage is applied to the shower head 10 by the radio frequency power source 23 to produce a plasma in the shower head 10. Then, a Ti film is formed on the Si wafer W by using the plasma.

In this embodiment, the Si wafer W is heated at 300 to 500° C., preferably 350 to 450° C. during the Ti film formation.

It is preferable that the flow rate of the $SiH_4$ gas is not less than 30% of the flow rate of the $TiCl_4$ gas, thereby the resulting Ti film has low Cl concentration. However, if the flow rate of $SiH_4$ gas relative to the flow rate of $TiCl_4$ gas is excessively high; the resulting Ti film has low Cl concentration, but is Si-rich, and thus has high resistivity, and is not useful. Thus, the flow rate of $SiH_4$ gas should be less than 100% of the flow rate of $TiCl_4$ gas. In addition, if the flow rate of $SiH_4$ gas relative to the flow rate of $TiCl_4$ gas is high, silicon-to-insulating film selectivity decreases, resulting in low step coverage. It is therefore preferable that the flow rate of $SiH_4$ gas is not more than 70%, more preferably not more than 50% of the flow rate of $TiCl_4$ gas. If the flow rate of $SiH_4$ gas is 70% or below of the flow rate of $TiCl_4$ gas, silicon-to-insulating film selectivity is not less than 1. It is also preferable that the flow rate of $SiH_4$ gas is from 0.15 to 0.35% of the sum of flow rates of all of the processing gases.

The other processing conditions are preferably set as follows. The frequency supplied by the radio frequency power source is in the range of 450 kHz to 60 MHz, preferably 450 kHz to 13.65 MHz, more preferably 450 kHz. The power supplied by the radio frequency power source is preferably in the range of 100 to 1000 W, more preferably 300 to 800 W. The pressure in the vessel 1 is preferably 0.5 to 10 torr, more preferably 1 to 7 torr. The flow rate of $TiCl_4$ gas is preferably 1 to 20 sccm, more preferably 1 to 10 sccm. The flow rate of $H_2$ gas is preferably 0.1 to 5 slm, more preferably 0.3 to 2 slm. The flow rate of Ar gas is preferably 0.1 to 3 slm, more preferably 0.3 to 2 slm. The flow rate of $SiH_4$ gas is preferably 0.1 to 10 sccm, more preferably 3 to 7 sccm, and is changed in correspondence to the change in the flow rate of $TiCl_4$ gas. With this embodiment, Ti films having a quality as good as Ti films formed at a high process temperature, can be formed by using a low-frequency, high-power radio frequency at a low process temperature.

Experiments were conducted to verify the effects of the present invention, in which Ti films were formed on a $SiO_2$ film provided with contact holes. In the experiments, the vessel 1 was evacuated to 5.0 torr, the output power of the radio frequency power source 23 (450 kHz) was 800 W, wafer temperature was 400° C., $H_2$ gas flow rate was 1 slm, Ar gas flow rate was 1 slm, $TiCl_4$ gas flow rate was 10 sccm, and $SiH_4$ gas flow rate was varied in the range of 1 to 10 sccm (1, 3, 5, 7, and 10 sccm). The period of time for the Ti film formation was 60 seconds. FIG. 8 is a graph showing the relationship of Cl concentration in the resulting Ti film with the flow rate of $SiH_4$ gas, i.e., the ratio of the flow rate of $SiH_4$ gas to the flow rate of $TiCl_4$ gas. The graph shows that, when the flow rate of $SiH_4$ gas was not less than 30% of $TiCl_4$ gas, Cl concentration in the resulting Ti film was not more than 2 at %.

Comparative experiments were conducted to verify the effects of the present invention, in which Ti films were formed on a $SiO_2$ film provided with contact holes. In the experiments, the vessel 1 was evacuated to 1.0 torr, the output power of the radio frequency power source 23 (13.56 MHz) was 200 W, H gas flow rate was 1 slm, Ar gas flow rate was 1 slm, $TiCl_4$ gas flow rate was 10 sccm. The period of time for the Ti film formation was 60 seconds. $SiH_4$ gas was not used. Wafer temperature was varied in the range of 400 to 600° C. (400, 450, 500, 550, 580 and 600° C.). FIG. 9 is a graph showing the relationship of the Cl concentration in the resulting Ti film with the wafer temperature. The graph shows that, in the event that the processing gases did not contain $SiH_4$ gas, if the wafer temperature was lower than 500° C., the Cl concentration in the resulting Ti film was remarkably increased.

Another embodiment of the present invention will be described with reference to FIGS. 10 and 11. When forming the Ti film on the semiconductor wafer, Ti films are also formed on the surfaces of the members, such as the vessel wall, the susceptor and the shower head. When the Ti film forming process are carried out repeatedly, thickness of the Ti films formed on the above members is increased, resulting in increase in the internal stress of the Ti films. Due to this, the Ti films are cracked and peeled off and particles are produced. This embodiment relates to methods of in-situ cleaning of such unnecessary Ti films formed on the members arranged in the vessel 1.

The cleaning methods include a plasma cleaning method and a thermochemical vapor cleaning method.

First, the plasma cleaning method will be described. FIG. 10 shows a CVD system, which is made by modifying the system shown in FIG. 1. It should be noted that, in FIG. 10 (and in FIG. 13), "80" is a electrode embedded in the susceptor 2, "81" is a radio frequency power source that supplies radio frequency power to the electrode 80, "82" is a thermocouple embedded in the susceptor 2, and "83" is a controller that controls the heater 4 based on the temperature detected by the thermocouple 82. These members 80-83 are not shown in FIG. 1, for simplicity of the drawing.

Figure 10:
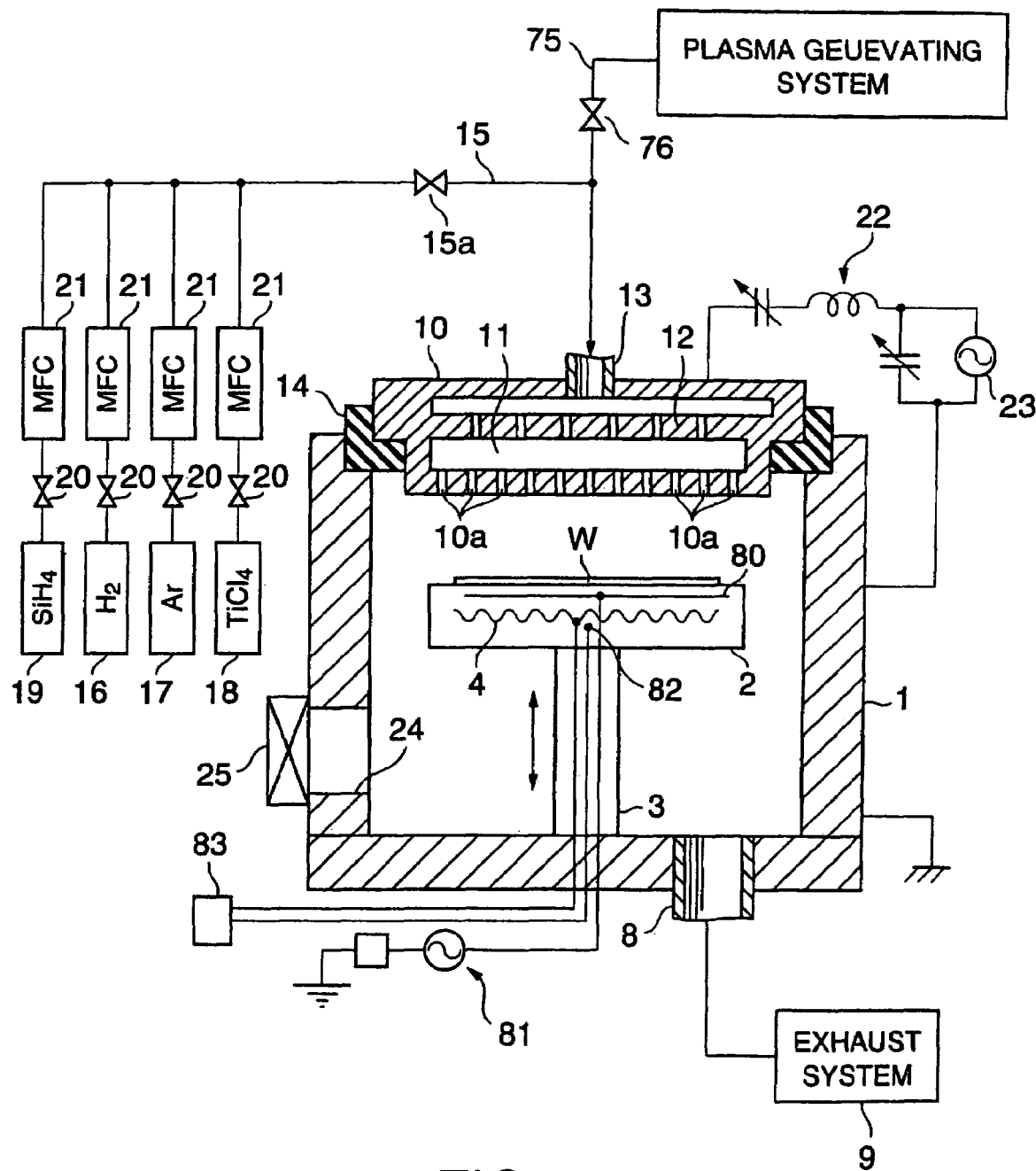
FIG. 10 is a sectional view of a film forming system provided with a plasma generating system arranged remote from the film forming chamber.
Figure 11:
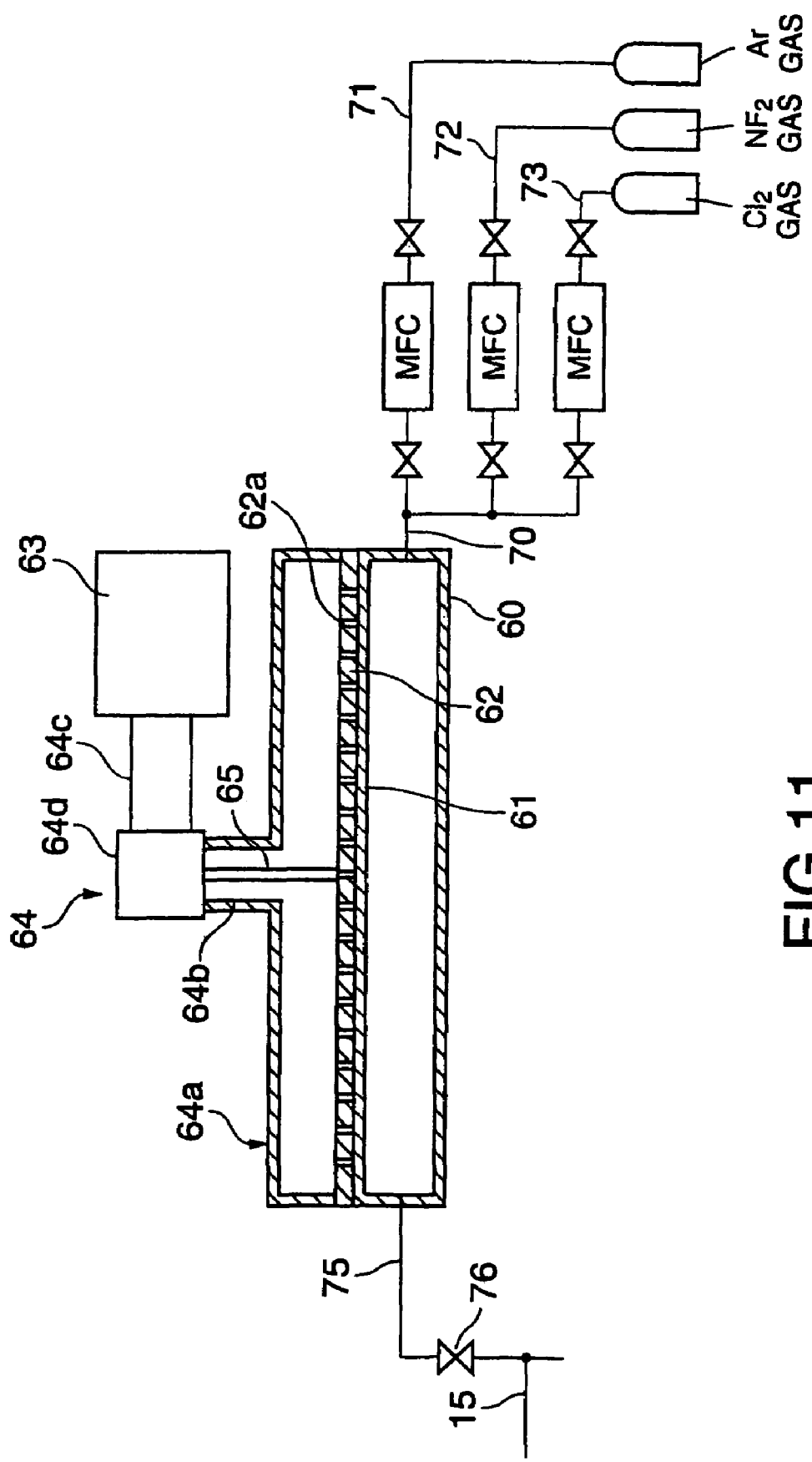
FIG. 11 is a sectional view of the plasma generating system schematically shown in FIG. 10.

As shown in FIGS. 10 and 11, the CVD system is provided with a plasma generating system that generates a plasma to be used for the plasma cleaning. The plasma generating system has a plasma generating vessel 60. The vessel 60 is made of dielectric material, such as quartz and ceramics (e.g., AlN, $Al_2O_3$, $Y_2O_3$, sapphire), and is formed in a boxy shape. Alternatively, the vessel 60 may be formed in a cylindrical shape. Connected to the plasma generating vessel 60 is a gas supply pipe 70, which is divided into three branches 71, 72 and 73: the first branch 71 being connected to an inert gas supply source; the second branch 72 being connected to a fluorine-containing gas source; and the third branch 73 being connected to a chlorine-containing gas source. Each of the branches 71, 72 and 73 is provided with a mass-flow controller and an open-close valve.

The inert gas supplied by the inert gas supply source is preferably Ar gas, however, He gas, Xe gas and Kr gas may be used instead of Ar gas. The fluorine-containing gas supplied by the fluorine-containing gas supply, source is preferably $NF_3$ gas, however, HF gas, $F_2$ gas, $CF_4$ gas, $C_2F_6$ gas, $S_3H_8$ gas, $C_4F_8$ gas and $SF_6$ gas may be used instead of HF gas. The chlorine-containing gas supplied by the chlorine-containing gas supply source is preferably $Cl_2$ gas, however, HCl gas, $CCl_4$ gas and $BCl_4$ gas may be used instead of $Cl_2$ gas. Various kinds of films made of metal or metal oxide, such as Si, $SiO_2$, W, WSi, WN, Ta, TaN, $Ta_2O_5$, BST, PZT, $HfO_3$, $La_2O_3$, $Pr_2O_3$, $RuO_2$, $Al_2O_3$, Ti and TiN, can be etched and removed, by appropriately selecting and mixing these gases. $H_2$ gas and/or $O_2$ gas may be added to the inert gas, the fluorine-containing gas and the chlorine-containing gas to increase the etch rate.

Arranged on the top face 61 of the plasma generating vessel 60 is a radial-line-slot antenna 62 (hereinafter referred to as RLSA), which is made of copper and is in the form of a circular disk. One or more additional RLSAs may be arranged on the side faces and/or the bottom face of the plasma generating vessel 60 to generate a plasma in the vessel 60 more effectively.

Figure 12:
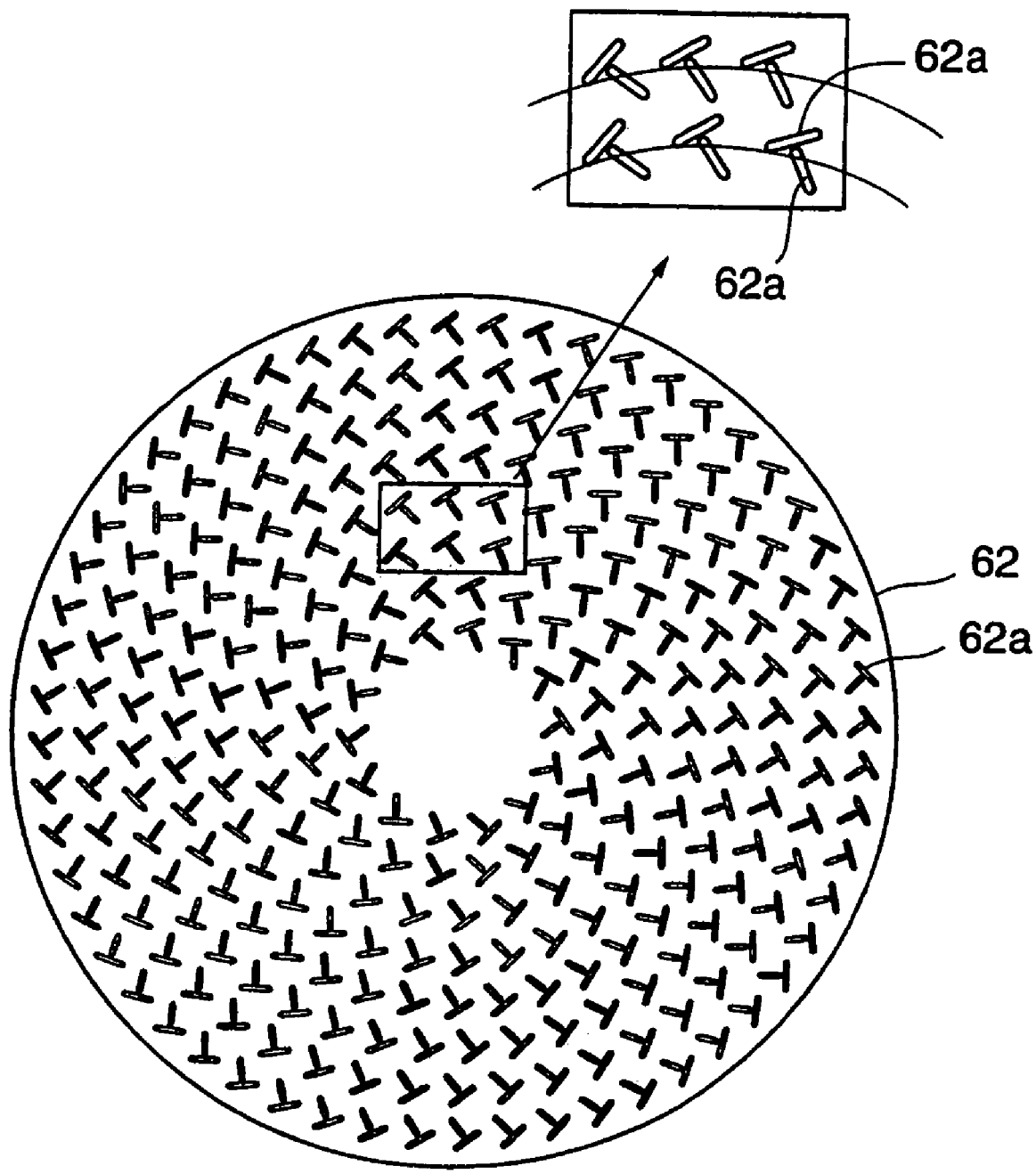
FIG. 12 is a plan view of RLSA shown in FIG. 11.

Referring to FIG. 12, showing a plan view of the RLSA 62, a plurality of slots 62a is formed in the RLSA 62. The slots 62a are arranged on concentric circles. Adjoining slots 62a forms "T" shape. The length and intervals of the slots 62a are determined by the wavelength of the microwave.

In the event that the RLSA 62 is used for generating plasma, both the electron temperature and plasma sheath voltage are low, the former being not more than 1 eV and the latter being not more than 3 eV, respectively. It is therefore possible to reduce the plasma damage to the objects to be cleaned by the plasma. Similar advantage is obtained by using an ICP (inductively couplet plasma) or a TCP (thermal inductively couplet plasma), however, it is more preferable to use the plasma generated by using the RLSA 62.

Referring again to FIG. 11, a waveguide 64 is connected to a microwave power source 63. The waveguide 64 comprises a flat cylindrical waveguide segment 64a, cylindrical waveguide segment 64b connected to the top end the segment 64a, and a rectangular waveguide segment 64c. The waveguide 64 is provided with a coaxial converter 64d. The top end of the waveguide segment 64b is connected to the bottom of the converter 64d, and one end of the waveguide segment 64c is connected to the side of the converter 64d. A shaft 65 made of conductive material is coaxially arranged in the waveguide segment 64b. The bottom end of the shaft 65 is connected to the central part of the RLSA 62. The top end of the shaft 65 is connected to top face of the waveguide segment 64b.

Connected to the plasma generating vessel 60 is a plasma supply pipe 75, in which an open-close valve 76 is arranged.

The plasma supply pipe 75 is connected to the gas supply pipe 15 at a position upstream of the gas supply port 13.

Next, the operations of the system shown in FIGS. 10 thru 12 will be described. After executing Ti film forming process for predetermined times, the semiconductor wafer is unloaded from the film-forming vessel 1, the open-close valve 15a is closed, and the open-close valve 76 is opened. The interior of the vessel 1 is heated up to a predetermined temperature, for example 100 to 500° C., and the interior of the film-forming vessel 1 is evacuated to a predetermined pressure. The pressure in the film-forming vessel 1 is controlled so that the pressure in the plasma generating vessel 60 communicating with the film-forming vessel 1 is in a predetermined range, preferably in the range of 0.1 to 20 torr. It is preferable that the pressure in the film-forming vessel 1 is lower than that in the plasma generating vessel 60, thereby the plasma generated in the plasma generating vessel 60 is introduced into the film-forming vessel 1 smoothly. The pressure in the film-forming vessel 1 is preferably 0 to 4 torr lower than the plasma generating vessel 60. A shut-off valve or a flow-control valve may be arranged in the plasma supply pipe 75 to control the pressure difference between the film-forming vessel 1 and the plasma generating vessel 60.

Next, the inert gas, the g fluorine-containing gas and the chlorine-containing gas are introduced into the plasma generating vessel 60 at respective predetermined flow rates. Preferably, the flow rates of the inert gas, the fluorine-containing gas and the chlorine-containing gas are 100 to 2000 sccm, 10 to 5000 sccm and 1 to 2000 sccm, respectively. It is also preferable that the flow rate of the inert gas is not less than 10% of that of the fluorine-containing gas, and that the flow rate of the chlorine-containing gas is from 10% to 100% of that of the fluorine-containing gas.

Then, the microwave power source 63 generates a microwave of predetermined frequency, for example 1 GHz to 60 GHz, preferably 1 GHz to 10 GHz, more preferably 2.45 GHz. The output power of the microwave power source 63 is 3 kW or above. Thereby, a plasma is generated in the plasma generating vessel 60.

The plasma thus generated is introduced into the shower head 10 via the plasma supply pipe 15 and the gas supply port 13, and then is introduced into the film-forming vessel 1. Since the vessel 1 is heated, the showerhead 10 and the members arranged in the vessel 1, such as susceptor 2, are also heated. The plasma thus introduced reacts with the Ti films formed on the above members to decompose the Ti films. The decomposition products (gases) are discharged from the vessel 1 through the exhaust port 8.

Experiments were conducted to determine a preferable flow rate of the chlorine-containing gas relative to the flow rate of the fluorine-containing gas, in which a $SiO_2$ film formed on a Si wafer were etched (removed) by using a plasma formed in the plasma generating vessel 60. In the experiments, a Si wafer (test piece) provided with a $SiO_2$ film thereon was loaded into the film-forming vessel 1, was placed on the susceptor 2, and was heated up to 300° C. The film-forming vessel 1 was evacuated to 532 Pa, and the plasma generating vessel 60 connected to the film-forming vessel 1 was thus evacuated to about 532 Pa or slightly above. The output power of the microwave power source 63 was 1000 W, the frequency of the microwave was 2.45 GHz. Ar gas (inert gas), $NF_3$ gas (fluorine-containing gas) and $Cl_2$ gas (chlorine-containing gas) were introduced into the plasma generating vessel 60. Ar gas flow rate was 1 slm, $NF_3$ gas flow rate was 1000 sccm, and $Cl_2$ gas flow rate was varied in the range of 100 to 300 sccm (50, 100, 150, 200, 250 and 300 sccm). A plasma generated in the plasma generating vessel 60 was introduced into the film-forming vessel 1 to etch the $SiO_2$ film formed on the Si wafer. The period of time for etching the $SiO_2$ film was 60 seconds. FIG. 14 is a graph showing the relationship of the etch rate with the $Cl_2$ gas flow rate. The graph shows that, it is preferable that the flow rate of $Cl_2$ gas is not less than 10% of the flow rate of $NF_3$ gas, to etch the $SiO_2$ film effectively.

Figure 13:
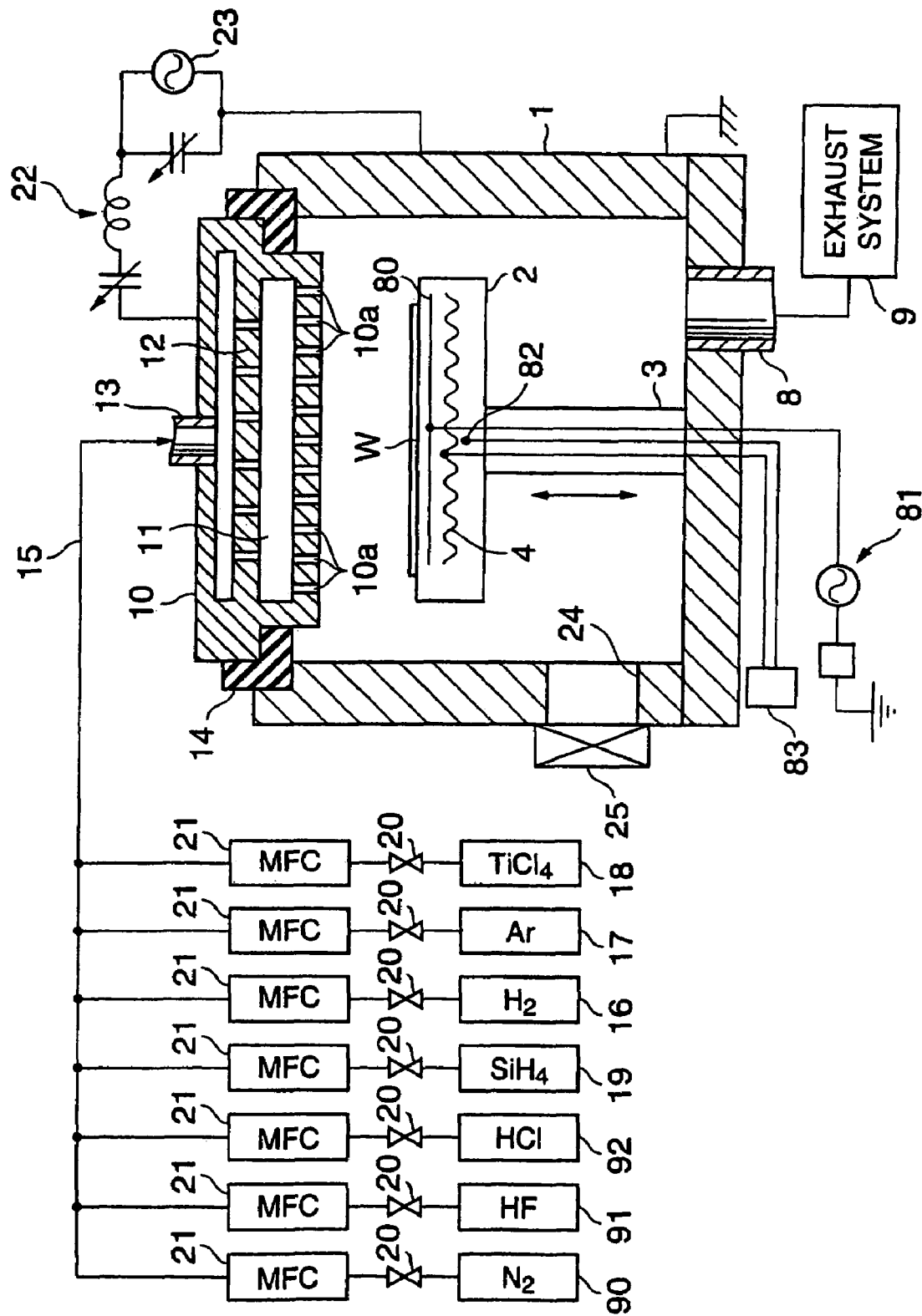
FIG. 13 is a sectional view of a film forming system provided with cleaning gas supply means.

Next, the thermochemical vapor cleaning method will be described. FIG. 13 shows a CVD system, which is made by modifying the system shown in FIG. 1. The CVD system shown in FIG. 13 differs from the system shown in FIG. 1 only in that the former further includes an $N_2$ gas source 90, an HF gas source 91 and an HCl gas source 92. Each of the pipes connected to the gas sources 90, 91 and 92 is provided with a open-close valve 20 and mass-flow controller 21.

Next, the operations of the system shown in FIG. 13 will be described. After executing Ti film forming process for predetermined times, the semiconductor wafer is unloaded from the vessel 1. The interior of the vessel 1 is heated up to a predetermined temperature, for example 200 to 500° C., and the interior of the vessel 1 is evacuated to a predetermined pressure, preferably 0.1 to 50 torr. Then, $N_2$ gas, HF gas and HCl gas are supplied into the vessel 1 at predetermined flow rates. Preferably, the flow rates of $N_2$ gas, HF gas and HCl gas are 100 to 2000 sccm, 10 to 5000 sccm and 1 to 2000 sccm, respectively.

These cleaning gases are introduced into the shower head 10 via the gas supply port 13, and then are introduced into the vessel 1. Since the vessel 1 is heated, the showerhead 10 and the members arranged in the vessel 1, such as susceptor 2, are also heated. The cleaning gases thus introduced react with the Ti films formed on, the above members to decompose the Ti films. The decomposition products (gases) are discharged from the vessel 1 through the exhaust port 8.

The above thermochemical vapor cleaning method is capable of removing not only Ti films and TiN films but also many kinds of films, such as films of W, WSi, WN, Ta, TaN, $Ta_2O_5$ and $SiO_2$, which can be removed by well-known thermochemical vapor cleaning method employing a $ClF_3$ gas. Since HF gas and HCl gas themselves are less poisonous than $CLF_3$ gas, more safety operation is possible.

In addition, it is possible to remove films formed of high-K materials, such as BST ($Bi_2SrTi_2O_9$), PZT ($Pb(Zr_{1-x}Ti_x)O_3$), $HfO_3$, HfSi, $La_2O_3$, $Pr_2O_5$ and $Al_2O_3$ by changing the mixing ratio of the above cleaning gases, or by mixing $H_2$ gas and $O_2$ gas with the above cleaning gases.

Although the invention has been described in its preferred embodiments with a certain degree of particularity, it is to be understood that the embodiments are illustrative and not restrictive and many changes and variations may be made therein without departing from the scope and spirit of the invention.

What is claimed is:

1. A cleaning method for removing a film formed on a surface of a process vessel defining a film forming chamber or a surface of a component member of a processing apparatus arranged in the film forming chamber, said method comprising the steps of:

evacuating a plasma generating chamber arranged remote from the film forming chamber to a predetermined vacuum at a pressure in a range of 0.1 to 20 Torr;

supplying cleaning gases including an inert gas, a fluorine-containing gas, and a chlorine-containing gas into the plasma generating chamber;

applying microwaves to the cleaning gases via a slot antenna provided in the plasma generating chamber, thereby converting the cleaning gases into plasma in the plasma generating chamber, heating the surface of the process vessel or the surface of the component member to a predetermined temperature;

feeding the cleaning gases thus converted into plasma from the plasma generating chamber into the film forming chamber so that the cleaning gases thus converted into plasma react with the film to decompose the film to produce a decomposition product; and discharging the decomposition product from the film forming chamber.

2. The method according to claim 1, wherein the fluorine-containing gas is selected from the group consisting of HF gas, $NF_3$ gas, $F_2$ gas, $CF_4$ gas, $C_2F_6$ gas, $S_3F_8$ gas, $C_4F_8$ gas and $SF_6$ gas.

3. The method according to claim 1, wherein the inert gas is selected from the group consisting of Ar gas, He gas, Kr gas and Xe gas.

4. The method according to claim 1, wherein the film to be removed is a film of a material selected from the group consisting of Ti, Si, W, WSi, WN, Ta, TaN, $Ta_2O_5$, $SiO_2$, BST (Barium Strontium Titanate), PZT (Lead Zirconium Titanate), $HfO_3$, $La_2O_3$, $Pr_2O_5$ and $Al_2O_3$.

5. The method according to claim 1, wherein the plasma generating chamber is maintained at a pressure not lower than the pressure in the film forming chamber, when the plasma is produced and is fed into the film forming chamber.

6. The method according to claim 5, wherein pressure difference between the plasma generating chamber and the film forming chamber is in a range of 0 to 4 Torr.

7. A cleaning method for removing a film formed on a surface of a process vessel defining a film forming chamber or a surface of a component member of a processing apparatus arranged in the film forming chamber, said method comprising the steps of:

evacuating a plasma generating chamber arranged remote from the film forming chamber to a predetermined vacuum at a pressure in a range of 0.1 to 20 Torr, and maintaining the plasma generating chamber at a pressure not lower than pressure in the film forming chamber;

supplying cleaning gases including an inert gas, a fluorine-containing gas, and a chlorine-containing gas into the plasma generating chamber;

converting the cleaning gases into plasma in the plasma generating chamber;

heating the surface of the process vessel or the surface of the component member to a predetermined temperature;

feeding the cleaning gases thus converted into plasma from the plasma generating chamber into the film forming chamber so that the cleaning gases thus converted into plasma react with the film to decompose the film to produce a decomposed product; and discharging the decomposed product from the film forming chamber.

8. The method according to claim 7, wherein pressure difference between the plasma generating chamber and the film forming chamber is in a range of 0 to 4 Torr.

9. The method according to claim 7, wherein the fluorine-containing gas is selected from the group consisting of HF gas, $NF_3$ gas, $F_2$ gas, $CF_4$ gas, $C_2F_6$ gas, $S_3F_8$ gas, $C_4F_8$ gas, and $SF_6$ gas.

10. The method according to claim 7, wherein the inert gas is selected form the group consisting of Ar gas, He gas, Kr gas, and Xe gas.

* * * * *